US000001445H

United States Statutory Invention Registration [19]

[11] Reg. Number: H1445

Culbreath et al. [43] Published: Jun. 6, 1995

[54] METHOD AND APPARATUS FOR ACTIVE CANCELLATION OF NOISE IN A LIQUID-FILLED PIPE USING AN ADAPTIVE FILTER

[76] Inventors: William G. Culbreath, 2814 Micah Ave., Henderson, Nev. 98014; Eric W. Hendricks, 13845 Talca Ave., San Diego, Calif. 92129; Robert J. Hansen, 757 Cricklewood Dr., State College, Pa. 16803

[21] Appl. No.: 952,453

[22] Filed: Sep. 30, 1992

[51] Int. Cl.[6] ..... H03B 29/00

[52] U.S. Cl. ..... 381/71

[58] Field of Search ..... 381/71

[56] References Cited

U.S. PATENT DOCUMENTS

| | | | |
|---|---|---|---|
| 4,473,906 | 9/1984 | Warnaka et al. . | |
| 4,736,431 | 4/1988 | Allie et al. . | |
| 5,022,082 | 6/1991 | Eriksson et al. | 381/71 |
| 5,091,953 | 2/1992 | Tretter | 381/71 |
| 5,170,433 | 12/1992 | Elliott et al. | 381/47 |

OTHER PUBLICATIONS

Warnaka, "Active Attenuation of Noise-The State of the Art" Noise Control Engineering, May-Jun. 1982, vol. 18, No. 3, pp. 100-110.

"Electronic Attenuation of Noise and Vibration," Noise Canelation Technologies, Inc., 1987.

Culbreath et al., "Active Cancellation of Noise in a Liquid-Filled Pipe Using an Adaptive Filter," 83 J. Acoust. Soc. Am. 1306 (No. 4, Apr., 1988).

W. G. Culbreath et al., Active cancellation of Noise in a Liquid-Filled Pipe Using an Adaptive Filter, J. Acoust. Soc. Am. 83(4), pp. 1306 ff., Apr. 1988.

*Primary Examiner*—Bernarr E. Gregory

[57] ABSTRACT

An method and apparatus for active noise cancellation in a conduit carrying a liquid, employing a detector hydrophone, an acoustic canceler downstream of the detector hydrophone, an error hydrophone, and an adaptive filter. The outputs of the detector hydrophone, acoustic canceler, and error hydrophone are directed into the adaptive filter, which uses them to select the form of acoustic signal which the canceler directs into the liquid to cancel the noise. One embodiment of the invention employs two such cancellation circuits, and an additional adaptive filter which globally optimizes the cancellation of both circuits.

5 Claims, 6 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

METHOD AND APPARATUS FOR ACTIVE CANCELLATION OF NOISE IN A LIQUID-FILLED PIPE USING AN ADAPTIVE FILTER

BACKGROUND OF THE INVENTION

The reduction of low-frequency sound in pipes and piping systems is a problem of great practical importance. One approach to addressing this problem in air-filled pipes, which has received considerable attention, is the use of active noise control, or "antisound." An acoustic signal is generated by one or more sound sources placed in the system that destructively interferes with the unwanted noise field. State-of-the art microprocessors can be used as digital, adaptive filters to synthesize the appropriate cancellation signal or signals by sampling the sound field in the duct. Experiments conducted to date in air-filled pipes and ducts have shown the utility of active control for reducing noise consisting of pure tones, bandwidth-limited white noise, and transient pulses.

The acoustic response of liquid-filled pipes differs from that of air-filled pipes in several significant ways. For example, that in an air-filled pipe, the pipe wall typically acts as a rigid or nearly rigid structural element, whereas a liquid-filled pipe, the finite loop stiffness of the pipe exerts a major influence on the propagation velocity of an acoustic disturbance in the pipe. For this reason, results applicable to air-filled pipes are not directly translatable to liquid-filled ones.

SUMMARY OF THE INVENTION

Accordingly, a primary object of the invention is permit active noise cancellation in liquid-filled conduits.

In accordance with these and other objects made apparent hereinafter, the invention concerns an active noise cancellation system having a detector hydrophone, an acoustic canceler, downstream of the detector hydrophone, an error hydrophone downstream of the canceler, and a digital electronic adaptive filter for receiving the outputs of the detector hydrophone, the acoustic canceler, and the error hydrophone, into the adaptive filter; which responds to these outputs to select the form of the cancellation. In this manner, the system operates much like a dual input servo controller, using the output of the error hydrophone as feedback to modify the canceler's signal, so as to produce a minimum signal at the error hydrophone.

Another embodiment of the invention employs a second such cancellation system downstream. The output of each system is fed to a further adaptive filter, which can then globally minimize noise in the conduit.

These and other objects, features, and advantages are best understood from the following detailed description of particular embodiments of the invention. It is understood, however, that the invention is capable of extended application beyond the precise details of these embodiments. Changes and modifications can be made to the embodiments that do not affect the spirit of the invention, nor exceed its scope, as expressed in the appended claims. The embodiments are described with particular reference to the accompanying drawings, wherein:

BRIEF DESCRIPTION OF THE DRAWINGS

FIG. 3 illustrates the coordinate system for data taken in the tests.

FIGS. 4 through 10 are graphs showing measured sound-pressure versus distance for various conduit directions and noise frequencies.

FIG. 11 is a graph of the frequency dependence of the time response of the adaptive filter used in the tests.

FIG. 12 is a graph of the frequency dependence of sound-pressure at the center of a liquid filled pipe under test, in the absence of cancellation.

DETAILED DESCRIPTION

Figure 1:
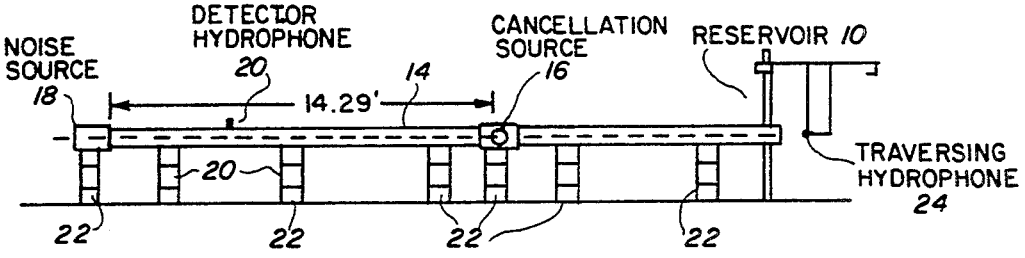
FIG. 1 is a schematic illustrating the environment in which the invention is used.
Figure 2:
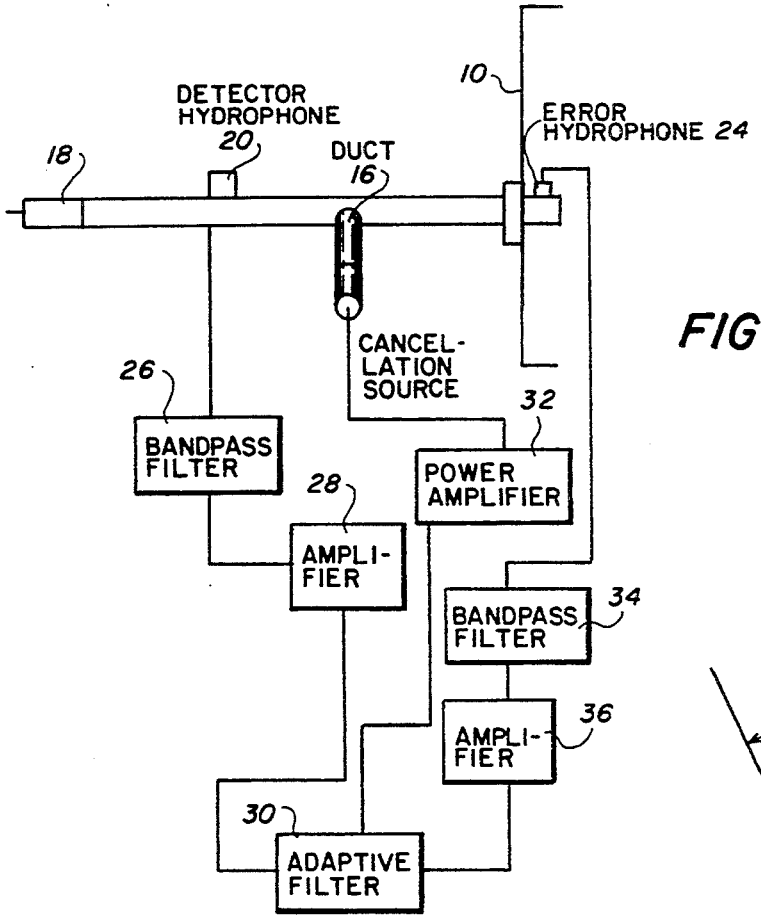
FIG. 2 illustrates one embodiment of the invention.

With reference to the drawing figures, wherein like numbers indicate like parts throughout the several views, FIGS. 1 and 2 illustrate one embodiment of the invention. A liquid carrying conduit 14, which empties into filled reservoir 10, has a source of unwanted acoustic noise 18. By noise, it is meant any undesired signal, even at a single frequency, not necessarily "white" or otherwise polychromatic noise. The cause of noise at 18 could result from any of a number of common circumstances, such as a pump or pipe bend at 18, or simple cavitation at 18. Conduit 16 is elevated on supports 22, which vibrationally isolate the conduit.

Disposed in conduit 16 is a hydrophone 20 for detecting noise. Disposed within reservoir 10 adjacent the terminus of conduit 14 is another hydrophone 24. Hydrophones 20 and 24 transduce acoustic signals present in their vicinities into corresponding electric signals, and direct their respective outputs to adaptive filter 30 via respective bandpass filters 26, 34 and amplifiers 28, 36. The bandpass filters are preferable because they prevent aliasing. Also disposed in conduit 14, downstream of noise source 18 and hydrophone 20, and upstream of hydrophone 24, is an electroacoustic driver 16. Driver 16 responds to the output of adaptive filter 30, via amplifier 26 and bandpass filter 26.

Adaptive filter 30 calculates the waveform with which to drive member 16, based on the inputs from hydrophones 20 and 24, in a manner which minimizes noise at hydrophone 24. (Stated alternatively, adaptive filter 30 chooses the signal to drive member 16 which minimizes an error signal/cost function, i.e. the signal detected at 24, in the presence of the constraint constituted by the signal detected at 20.) Adaptive filter 30 is preferably a digital microprocessor, programmed with any of the numerous algorithms which are used to perform cost-minimization calculations, e.g. the Wiener-Hopf least-mean-squares-algorithm.

EXAMPLE

An experimental test was performed, using apparatus as shown in FIGS. 1–2. Bandpass filters 26, 34 were Wavetec, Rockland models 452, and limited signals to the 80 to 700 Hz band. Amplifiers 28, 34 were Ithaco model 456M105, producing a total gain of about 80 dB. Adaptive filter 30 itself removed high frequency noise associated with digital to analog conversion. Hydrophone 24's output was measured on an oscilloscope, as well as on a digital rms volt meter (Hewlett Packard model 3466A). The rms voltage outputs of the hydrophones were used to determine the amount of cancellation achieved with the adaptive filter. The hydrophone gain was fairly constant over the frequencies of interest. The hydrophone gain was approximately −209 dB re: 1V/μPa in the range between 100 Hz and 5 kHz. For most tests, sine waves at a single frequency were generated by a function generator (Hewlett Packard model 203A) connected to the noise source through another 200 W power amplifier. To study the effects of two superimposed sine waves, a second identical function generator was added in parallel to the first. For system identification studies, a random noise generator was connected to the noise source through a bandpass filter and the power amplifier.

Conduit 16 was 8 in. (203.2 mm) diameter duct, schedule 30 PVC pipe, as was the tee fitting used to mount cancellation source 16 in conduit 14. The duct wall was 0.5 in. (12.7 mm) thick and the outside pipe diameter was 8.5 in. (216 mm). The 24.7 ft (7.55 m) long was made up of two shorter segments joined by the tee that accommodated the active source. Supports 22 were concrete blocks and wooden shims. Wooden cradles (not shown) were constructed with rubber isolators to hold the brass-encased sound sources 18 and to prevent noise from propagating through the concrete blocks and into the floor due to vibration of the sound sources. The pipe extended 6 in. (0.15 m) inside of the reservoir, and the pipe and reservoir were mechanically isolated by a flexible gasket to prevent transmission of vibration energy between the two structures. The reservoir was constructed of 0.25 in. (6.4 mm) thick mild steel. It was 60 in. (1.52 m) in height, 20 ft (6.1 m) in length, and 10 ft (3.05 m) in width. The water level was 52 in. (1.32 m). The pipe entered the duct at a height of 2.5 ft (0.76 m) and 3 ft (0.91 m) from one of the longer sides of the reservoir.

The digital, adaptive filter 30 employed in the tests was a commercially available implementation of the Wiener-Hopf least-mean-squares algorithm, mentioned above. The unit used (Adaptive Digital Systems, Ind., model MASP416) was modified to allow differencing of the performance and input signals externally since the resulting error signal was formed in the duct itself by the linear superposition of the original unwanted noise and the output of the cancellation sound source 16. In the course of the experimental study, it was determined that the filter performance was particularly sensitive to a time delay setting that accounted for the "time of flight" of an acoustic wave from the detector hydrophone to the cancellation source. In the present work the approximate value of this delay was computed from a priori measurements of sound propagation velocity in the pipe 14. It has been noted that this delay would be adjusted adaptively by a second adaptive filter in an application of active noise control.

The sound propagation velocity measurements were performed by installing two USRD (Underwater Sound Reference Detachment located in Orlando, Fla., which is a part of the Naval Research Laboratory of Washington, D.C.) type F42D hydrophones at different axial locations in the pipe. The time delay between the passage of a given part of the acoustic wave was measured as a function of frequency, with the upstream "noise" source being used to ensonify the pipe. The results were compared with previously conducted experiments.

Results

In the 100 to 200 Hz frequency range, where most sound cancellation experiments were performed in the tests, the measured sound propagation velocity in the duct was 364 m/s. This agrees well with the value of 365 m/s that have been obtained experimentally by others for identical piping material. Also, it agrees reasonably well with that computed by using the nominal physical properties of PVC, together with the formula for $C_p$, the sound propagation velocity in a pipe at very low frequency:

$$C_p=(Eh/2\rho a)^{\frac{1}{2}}.$$

Here. E and $\rho$ are the Young's modulus and density of the pipe material, respectively, h is the pipe wall thickness, and $a$ is the pipe radius. For these tests, the computed $C_p$ is 380 m/s. Of particular note is that the sound propagation velocity in this pipe, filled with water, is only about one-fourth the free-field value for water. If the pipe were rigid, the two propagation velocities would be equal.

Figure 3:
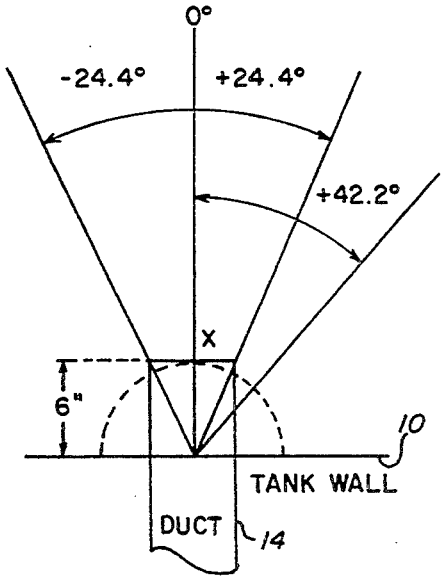
FIGS. 3 through 12 concern tests done on apparatus like that shown in FIGS. 1–2. In particular.

Experiments were conducted in the duct system with the adaptive filter to determine the maximum possible attenuation of unwanted noise at the pipe exit duct and in the water reservoir, as well as the time required for adaptation to this condition. FIG. 3 shows the coordinate system employed for hydrophone 24 in the experiment. The coordinate lines all lie in the horizontal plane through which the pipe centerline passes. The sound-pressure level measurements were referenced to the ambient noise level in the tank with the sound sources turned off. (The ambient noise level was designated as 0 dB.)

Figure 4:
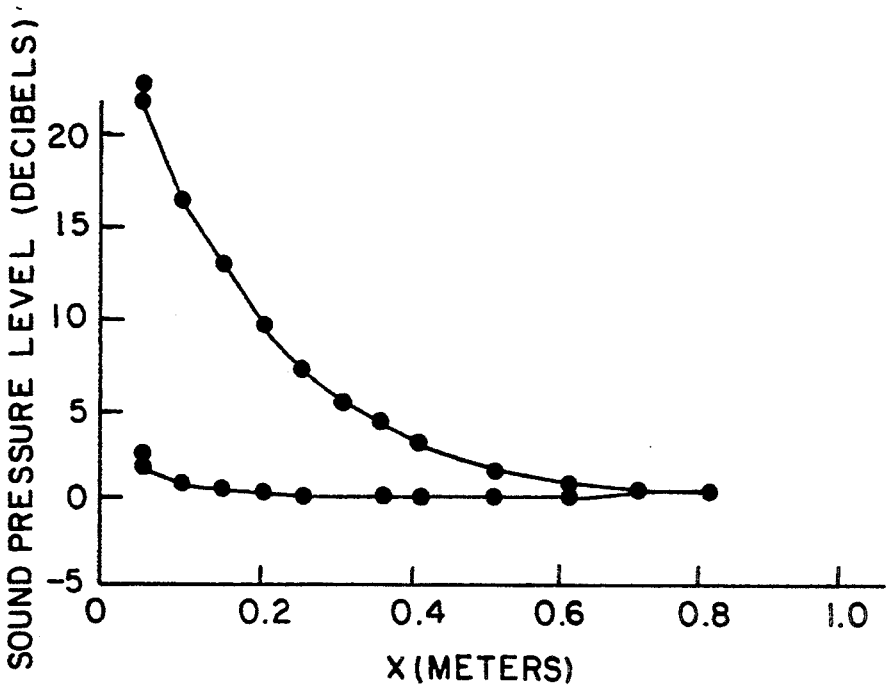
Figure 5:
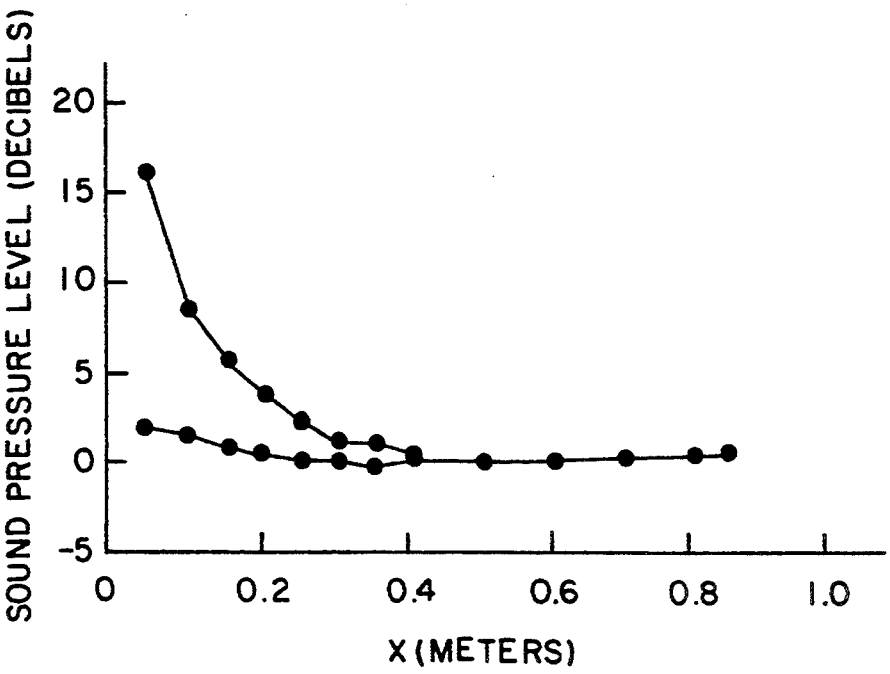
Figure 6:
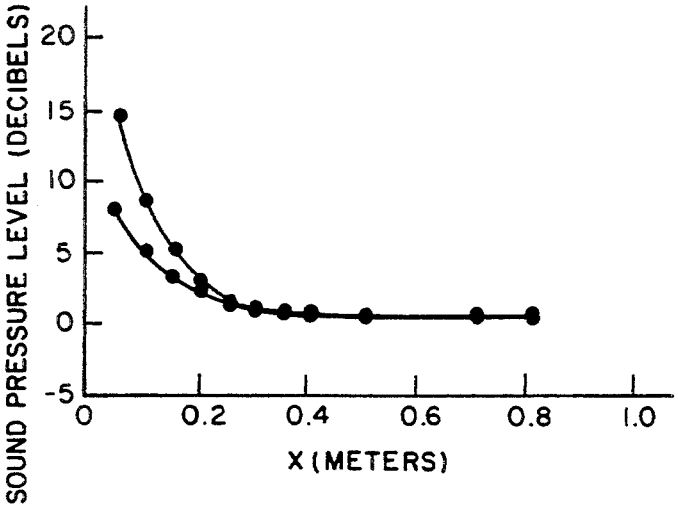
Figure 7:
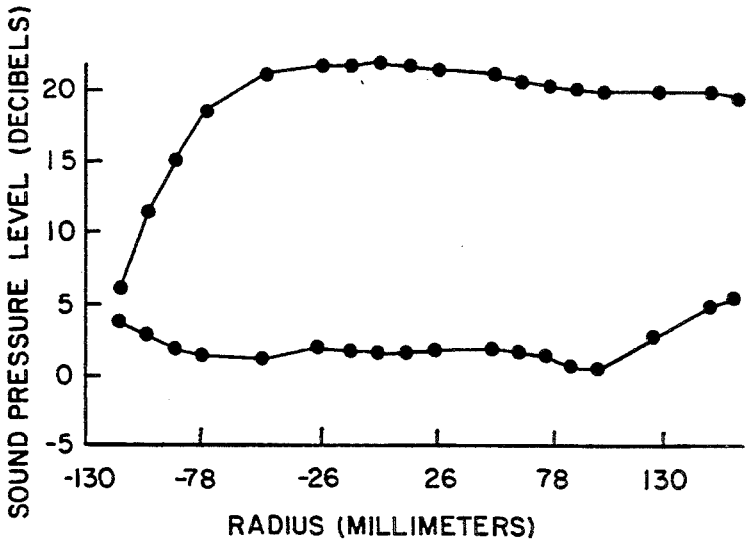

Experimental results obtained at 100 Hz and 0° are shown in FIG. 4. At the open and of the pipe (x=0.5 ft), the uncancelled noise level was about 23 dB above the canceled level. This differential decreases with increasing x because the sound-pressure level in the tank due to the upstream noise source decreases with x in the absence of cancellation, while the canceled level at 100 Hz and 0° is essentially equal to the ambient noise level at all x. The results for the same frequency and 24.4° orientation are shown in FIG. 5. In this case also, the level with the cancellation source operating is essentially the ambient level in the tank, as is also the case along the −24.4° line. FIG. 6 shows the companion result along the 42.2° line. Finally, FIG. 7 is a plot of the attenuation found across the duct outlet at 100 Hz. About 20 dB of attenuation was found across all of the pipe cross section except near the pipe walls. The asymmetry in the plot may have been due to the proximity of the duct exit to a side wall of the reservoir (3 ft).

Figure 8:
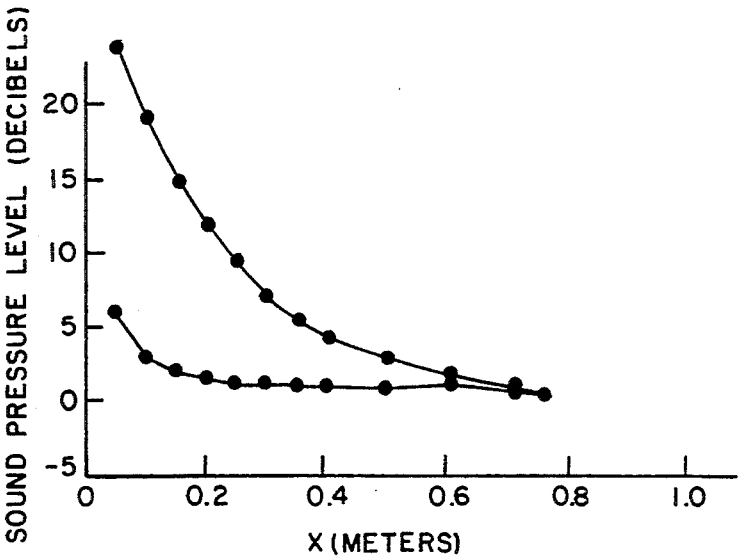
Figure 9:
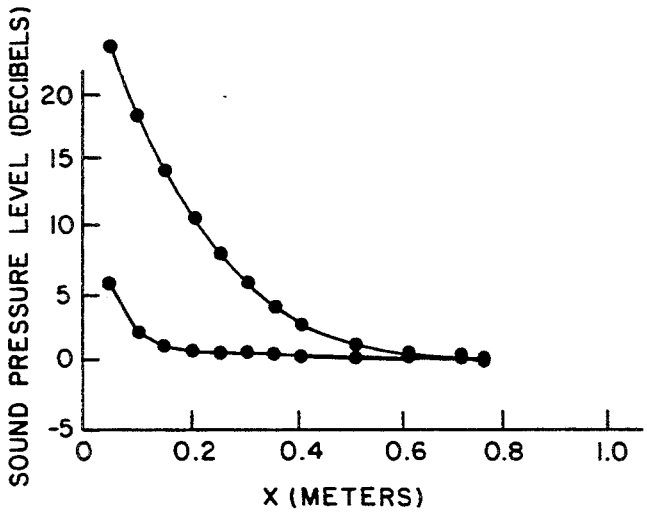

Qualitatively similar results were obtained when the "noise" was a sine wave at 150 and 200 Hz. FIGS. 8 and 9 show the variation in sound pressure level with and without cancellation along the 0° line at these two frequencies.

Figure 10:
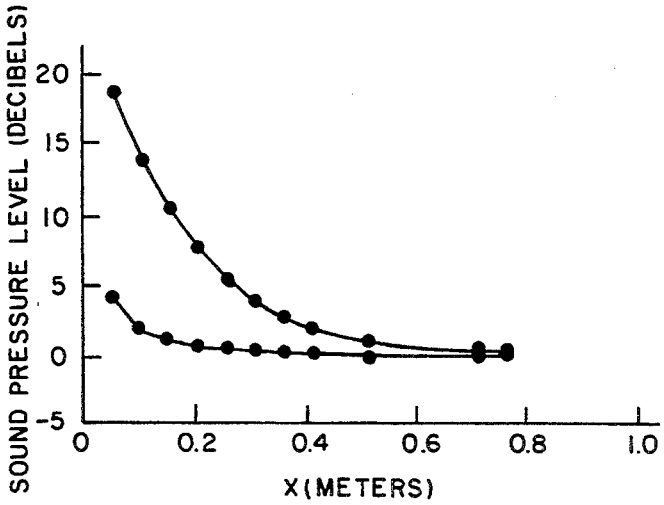

FIG. 10 demonstrates the cancellation realized when the "noise" consisted of two sinusoids of equal magnitude. The frequencies were 100 and 146 Hz. Cancellation measured along the duct centerline was still excellent, the canceled noise level in the downstream reservoir dropping to the ambient level except right at the duct exit.

Figure 11:
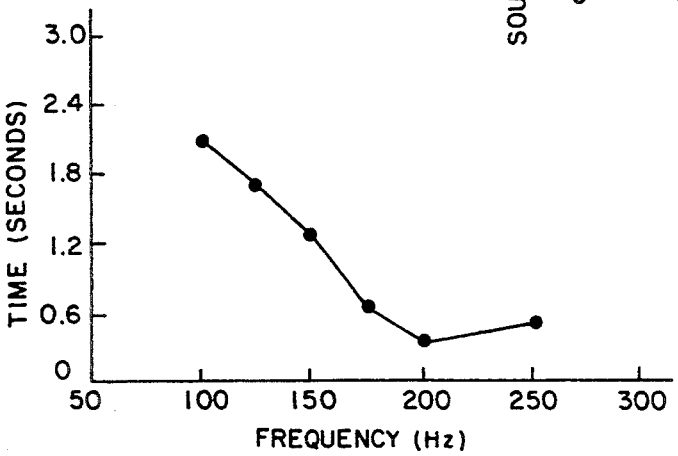

FIG. 11 shows the filter adaptation times measured in the experiments with the particular digital, adaptive filter employed. The situations chosen were based on sinusoidal input noise at single tones. According to the plot, the maximum response time was 2 s at 100 Hz and the minimum time occurred at 200 Hz with a time of 0.33 s. When 90 and 150 Hz sine waves were superimposed and introduced as noise, the response time was only 0.35 s. These response times were obtained with the filter time delay manually set to the value that appeared to give the best performance at the frequency or frequencies being employed.

Figure 12:
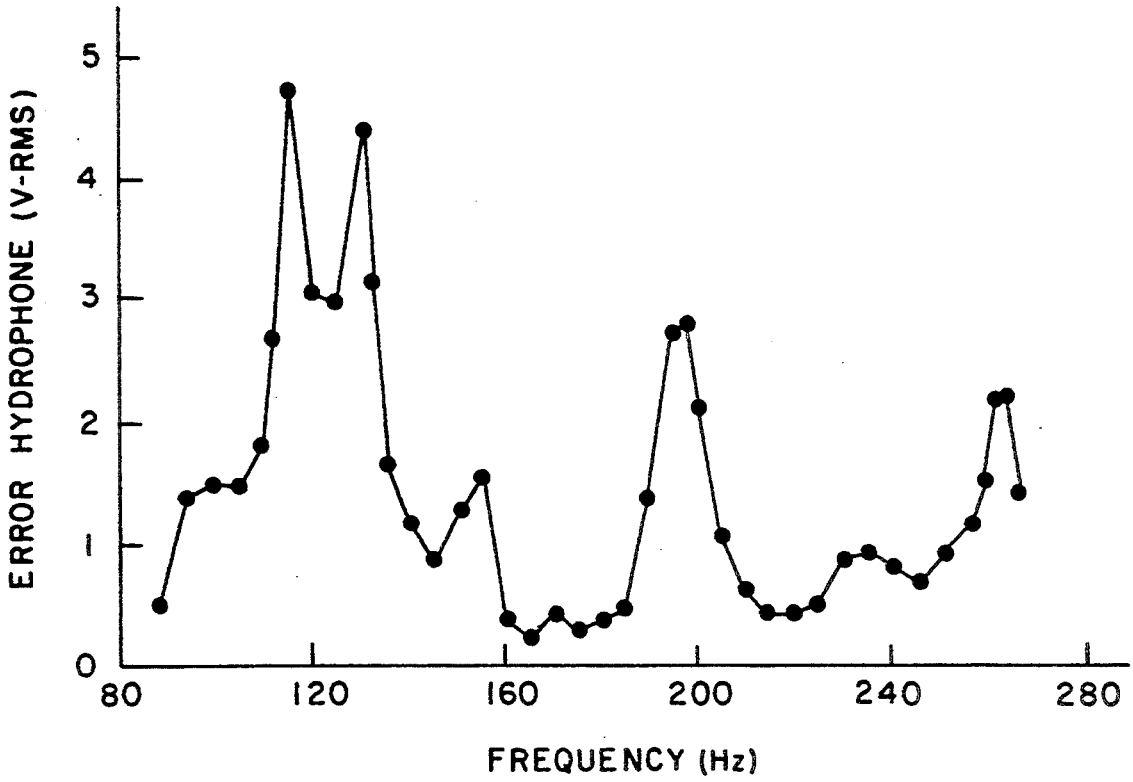

In the absence of active cancellation, the liquid-filled pipe equivalents of organ pipe resonances occur at selected frequencies. These resonances are due to impedance mismatches in the pipe system and the associated standing wave patterns that are created in the pipe. The system used in the present work has three locations where such an impedance mismatch exists: (1) at the upstream noise source; (2) at the tee that accommodates the active cancellation source 16; and (3) at the downstream end of the pipe due to the area difference between the pipe and the reservoir. At resonant conditions, the sound-pressure level at the pipe outlet is high compared to other conditions. FIG. 12 shows the measured hydrophone output at the pipe exit (no cancellation) as a function of frequency. It is important to note that the cancellation experiments reported herein were conducted both near a strong resonance condition (200 Hz) slightly removed from a weaker resonance (150 Hz) and away from another resonance condition (100 Hz). Active cancellation was effective in all cases.

The origin of all resonant peaks in a multisegment piping system such as employed in the present work can be difficult to ascertain. Some insight may be gained, however, by using the measured propagation velocity in the pipe to estimate the frequencies at which standing wave fields produce a resonance condition. In the present case, such fields can be associated with the entire pipe length (7.55 m) or one of the two shorter segments on either side of the cancellation source (4.36 and 3.19 m). The computed fundamental resonant frequencies for these three lengths are given in Table I, together with multiples of (2 m+1), where m is an integer.

TABLE I

| Pipe length (m) | $f_0$ (Hz) | $3f_0$ (Hz) | $5f_0$ (Hz) |
|---|---|---|---|
| 7.55 | 24 | 72 | 120 |
| 4.36 | 42 | 126 | 210 |
| 3.19 | 57 | 171 | 285 |

These multiples of the resonant frequency were clearly evident in previous experiments and related theoretical work. Some correspondence with the resonant peaks of FIG. 12 ar evident: (1) entire pipe length, m=2 gives 120 Hz compared to 115 Hz for the lowest frequency peak in FIG. 12; (2) 4.36 m pipe length, m=1 gives 126 Hz compared to 130 Hz for the second peak in FIG. 12; (3) 4.36 m pipe length, and m=2 gives 209 Hz compared to 197 Hz for the third dominant resonant peak of FIG. 12.

Conclusion from the Example

Low-frequency noise at, and emanating from, the exit of a liquid-filled pipe is effectively reduced by active noise control. Reductions in the 20 dB range were observed. Moreover, the adaptation time of the digital adaptive filter employed to control the active sound source was small. While improvements to the implementation employed herein can be incorporated, such as adaptive control of the time delay setting for the adaptive filter, the example clearly shows that active noise control is a viable, effective, means of low-frequency noise control in liquid-filled pipes and piping systems.

Figure 13:
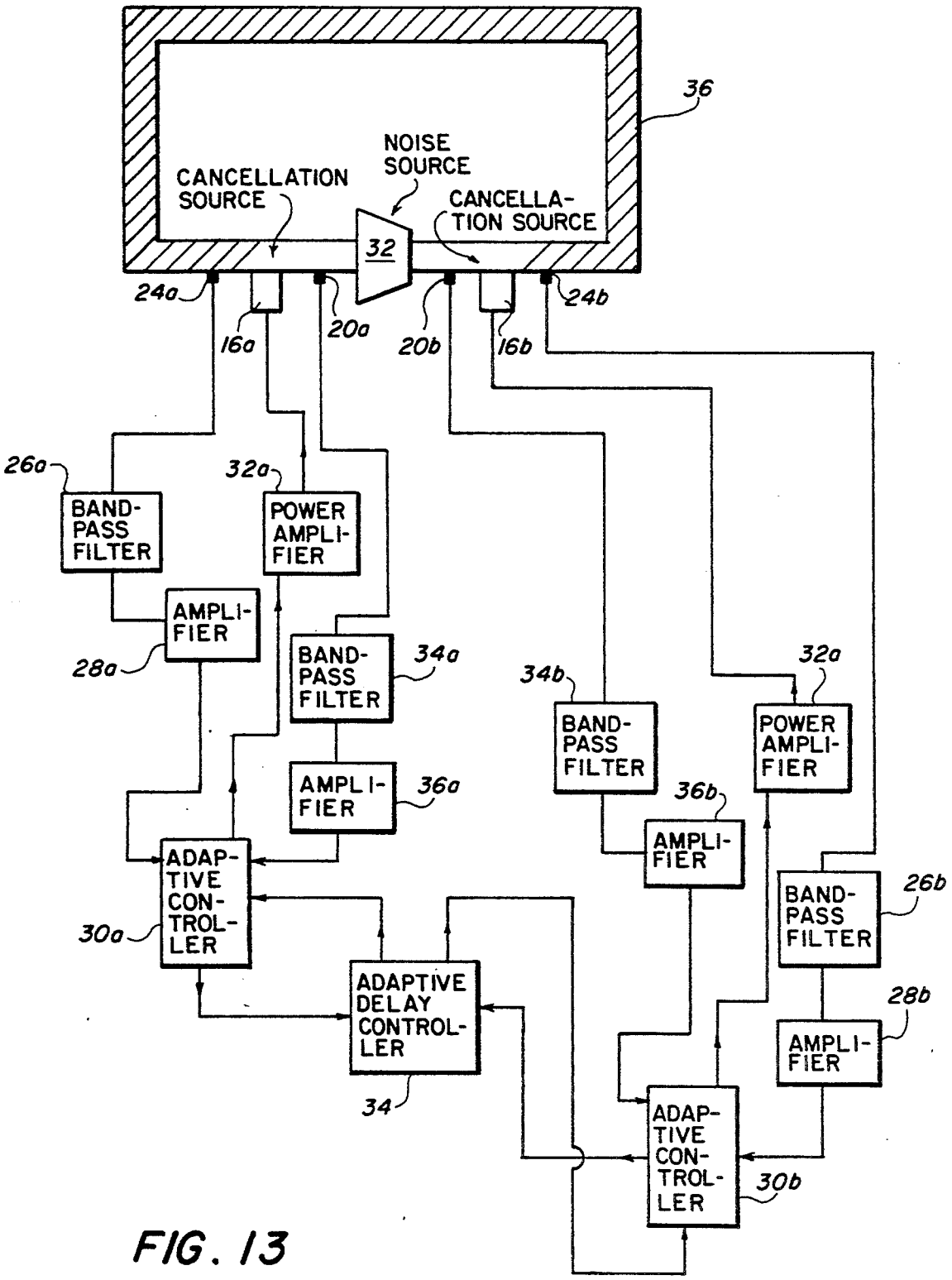
FIG. 13 is a schematic illustrating another embodiment of the invention.

FIG. 13 shows another embodiment of the invention, in which a conduit 36 has a source of noise 32, which is canceled by two circuits of the kind shown in FIG. 2. (Reference numerals associated with individual components of the two circuits indicate to which of the two circuits each component belongs by terminating in either "a" or "b," respectively ) On either side of noise source 32 are detector hydrophones 20*a* and 20*b*, error hydrophones 24*a* and 24*b*, and cancellation drivers 16*a* and 16*b*. As with the circuit of FIG. 2, the transduced outputs of hydrophones 20*a*, 20*b* are directed to adaptive controllers 30*a*, 30*b*, respectively, via respective bandpass filters 34*a* and 34*b* and amplifiers 36*a*, 36*b*, to respective adaptive controllers 30*a*, 30*b*. Similarly, and again as with the circuit of FIG. 2, the transduced signals output from error hydrophones 24*a*, 24*b* are directed to their respective controllers 30*a*, 30*b* via bandpass filters 26*a*, 26*b*, and 28*a* and 28*b*. In this circuit, however, controllers 30*a*, 30*b* are interlocked with master controller 34, which adaptively controls the relative phase with which cancellation signals are fed to drivers 16*a*, 16*b*, to optimize noise cancellation. The algorithm with which controller 34 is programmed to do this could be any number of digitally implemented adaptive cost-minimization algorithms, of which the previously mentioned Wiener-Hopf least-means-squares algorithm is one example. Master controller 34 allows for global minimization of the sound in duct 36, and can adapt to state changes in the systems. Global controller 34 monitors local controllers 30*a* and 30*b*, balances the changes made locally against a global cost-minimization function, and modifies the performance accordingly. In addition, if the system undergoes a change of state (e.g., the sound speed of the liquid in duct 36 changes) global controller 34 can adapt to that.

The invention has been described in what is considered to be the most practical and preferred embodiments. It is recognized, however, that obvious modifications to these embodiments may occur to those with skill in this art. Accordingly, the scope of the invention is to be discerned solely by reference to the appended claims.

We claim:

1. An active noise cancellation system for a conduit carrying a liquid, said system comprising:

a first detector hydrophone for detecting acoustic noise in said liquid;

a first acoustic canceler, downstream of said first detector hydrophone, for directing a first acoustic cancellation signal into said liquid;

a first error hydrophone for detecting acoustic signals downstream of said first acoustic canceler;

a first digital electronic adaptive filter;

a first means for imputing, said first means for imputing being effective to imput the outputs of said first detector hydrophone, said first acoustic canceler, and said first error hydrophone, into said first adaptive filter;

wherein said first adaptive filter is effective, responsive to said outputs of said first detector hydrophone, said first acoustic canceler, and said first error hydrophone, to drive said first acoustic canceler in a manner effective to minimize noise at said first error hydrophone according to a preselected local cost function;

wherein said system further comprises:

a second detector hydrophone for detecting acoustic noise in said liquid;

a second acoustic canceler, downstream of said second detector hydrophone, for directing a second acoustic cancellation signal into said liquid;

a second error hydrophone for detecting acoustic signals downstream of said canceler;

a second digital electronic adaptive filter;

a second means for imputing, said second means for imputing being effective to imput the outputs of said second detector hydrophone, said second acoustic canceler, and said second error hydrophone, into said second adaptive filter; and wherein said second detector hydrophone is downstream of said first error hydrophone;

wherein said second adaptive filter is effective, responsive to said outputs of said second detector hydrophone, said second acoustic canceler, and said second error hydrophone, to drive said second acoustic canceler in a manner effective to minimize noise at said second error hydrophone according to a preselected local cost function; and said system further comprising a master adaptive controller responsive to said first and said second error hydrophones for causing said first and second adaptive filters to globally minimize noise at said first and second hydrophones according to a preselected global cost function.

2. The system of claim 1, wherein:

at least one of said means for inputing comprises: a bandpass filter for electronically filtering the output of said detector hydrophone, and an amplifier for amplifying the output of said detector hydrophone.

3. A method of noise cancellation in a system having a conduit carrying a liquid, said method comprising steps for:

employing a first and second detector hydrophone for detecting acoustic noise in said liquid;

employing a first and second acoustic canceler for directing a responsive first and second acoustic cancellation signal into said liquid;

employing a first and second error hydrophone for detecting acoustic signals downstream of said a first and second canceler, respectively;

inputing the outputs of said first detector hydrophone, said first acoustic canceler, and said first error hydrophone, into a first adaptive filter, wherein said first adaptive filter is effective, responsive to the outputs of said first detector hydrophone, said first acoustic canceler, and said first error hydrophone, to drive said first acoustic canceler in a manner effective to minimize noise at said first error hydrophone according to a selected local cost function;

imputing the outputs of said second detector hydrophone, said second acoustic canceler, and said second error hydrophone, into a second adaptive filter, wherein said second adaptive filter is effective, responsive to the outputs of said second detector hydrophone, said second acoustic canceler, and said second error hydrophone, to drive said second acoustic canceler in a manner effective to minimize noise at said second error hydrophone according to a preselected local cost function; and imputing the outputs of said first and second error hydrophone into a master adaptive controller effective to cause said first and second adaptive filters to globally minimize noise at said first and second hydrophones according to a preselected global cost function.

4. The method of claim 3, wherein:

at least one of aid hydrophones used in at least one of said steps for employing a detector hydrophone comprises: a bandpass filter for electronically filtering the output of said detector hydrophone.

5. An active noise cancellation system for a conduit carrying a liquid, said system comprising:

first and second detector hydrophones for detecting acoustic noise in said liquid;

first and second acoustic cancelers for directing respective first and second acoustic cancellation signals into said liquid;

first and second error hydrophones for detecting acoustic signals in said liquid;

first and second digital electronic adaptive filters;

first means for imputing effective to imput the outputs of said first detector hydrophone, said first acoustic canceler, and said first error hydrophone, into said first adaptive filter;

said first adaptive filter is effective, responsive to said outputs of said detector hydrophone, said first acoustic canceler, and said first error hydrophone, to drive said first acoustic canceler in a manner effective to minimize noise at said first error hydrophone according to a preselected local cost function;

said second adaptive filter is effective, responsive to said outputs of said second detector hydrophone, said second acoustic canceler, and said second error hydrophone, to drive said second acoustic canceler in a manner effective to minimize noise at said second error hydrophone according to a preselected local cost function; and wherein:

said first detector hydrophone, said first acoustic canceler, and said first error hydrophone are each upstream of each of said second detector hydrophone, said second acoustic canceler, and said second error hydrophone; and said system further comprises a master adaptive controller responsive to said first and said second error hydrophones for causing said first and second adaptive filters to globally minimize nose at said first and second hydrophones according to a preselected global cost function.

* * * * *